United States Patent [19]

Banerjee et al.

[11] Patent Number: 5,180,686

[45] Date of Patent: Jan. 19, 1993

[54] METHOD FOR CONTINUOUSLY DEPOSTING A TRANSPARENT OXIDE MATERIAL BY CHEMICAL PYROLYSIS

[75] Inventors: Arindam Banerjee, Madison Heights; Subhendu Guha, Troy, both of Mich.

[73] Assignee: Energy Conversion Devices, Inc., Troy, Mich.

[21] Appl. No.: 770,734

[22] Filed: Oct. 1, 1991

Related U.S. Application Data

[63] Continuation of Ser. No. 602,893, Oct. 23, 1990, abandoned, which is a continuation of Ser. No. 264,549, Oct. 31, 1988, abandoned.

[51] Int. Cl.$^5$ ............... H01L 21/00; H01L 21/02; H01L 31/04; H01L 31/18
[52] U.S. Cl. ............................ 437/181; 437/2; 437/180; 437/225; 437/228; 156/252; 156/256; 156/258
[58] Field of Search ............ 437/2, 181; 136/252, 136/256, 258

[56] References Cited

U.S. PATENT DOCUMENTS 4,355,196 10/1982 Chai .................................. 437/2
4,410,558 10/1983 Izu et al. ......................... 427/39
4,514,583 4/1985 Izu et al. ........................ 136/256
4,571,350 2/1986 Parker et al. .................. 427/109
4,719,127 1/1988 Greenberg ...................... 427/165

OTHER PUBLICATIONS

Aranovich, Jr., Optical and Electrical Properties of ZnO Films Prepared by Spray Pyrolysis for Solar Cell Applications, J. Vac. Sci. Tech., 16(4), Jul. 1979, pp. 994–1003.

Ortz, A., Lack of Chemical Interaction of Hydrogenated Amorphous Silicon With Indium–Doped Zinc Oxide Transparent Conductive Films, J. Non. Cryst. Solids, vol. 103, No. 1, pp. 9–13, Jun. 1988.

Tomas, M, A ZnO/p-CuInSe$_2$ Thin Solar Cell Prepared Entirely by Spray Pyrolysis, Thin Solid Films, 90 (1982), pp. 419–423.

Garcia, F., Photovoltaic Characteristics of Spray Pyrolyzed Zinc Oxide Films on n and p Type Silicon, Chem. Abs., vol. 103, 1985, 90412h, p. 90418.

Primary Examiner—Brian E. Hearn
Assistant Examiner—B. Everhart
Attorney, Agent, or Firm—Marvin S. Siskind

[57] ABSTRACT

A method of depositing a layer of doped or undoped wide band gap oxide material by chemical spray pyrolysis, upon a continuously advancing, elongated web of substrate material in a continuous, roll-to-roll process.

10 Claims, 1 Drawing Sheet

METHOD FOR CONTINUOUSLY DEPOSTING A TRANSPARENT OXIDE MATERIAL BY CHEMICAL PYROLYSIS

This application is a continuation of application Ser. No. 07/602,893 filed on Oct. 23, 1990, now abandoned, which is a continuation of application Ser. No. 07/264,549 filed on Oct. 31, 1988 now abandoned.

FIELD OF THE INVENTION

This invention relates generally to a method for the continuous fabrication of thin film semiconductor devices of the type which include a layer of material, such as a layer of transparent, electrically conductive oxide material operatively disposed in electrical communication with and in superjacent or subjacent relationship to a body of semiconductor alloy material. More particularly, the present invention provides for the high rate deposition of a transparent conductive oxide material in intimate contact with the semiconductor body of a photovoltaic device in a manner which prevents damage to said body.

BACKGROUND OF THE INVENTION

Single crystal photovoltaic devices, especially silicon photovoltaic devices have been utilized for some time as sources of electrical power because they are inherently non-polluting, silent and consume no expendable natural resources in their operation. However, the utility of such devices is limited by problems associated with the manufacture thereof. More particularly, single crystal materials are: (1) difficult to produce in sizes substantially larger than several inches in diameter; (2) thicker and heavier then their thin film counterparts; and (3) expensive and time consuming to fabricate.

Recently, considerable efforts have been made to develop processes for depositing large areas of amorphous semiconductor films, which can be doped to form p-type and n-type materials for the production of p-i-n type photovoltaic devices substantially equivalent to those produced by their crystalline counterparts. It is to be noted that the term "amorphous" as used herein, includes all materials or alloys which have long range disorder, although they may have short or intermediate range order or even contain, at times, crystalline inclusions. Also, as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, optical gap and absorption constant occur.

It is of obvious commercial importance to be able to mass produce photovoltaic devices such as solar cells. However, with crystalline cells, mass production was limited to batch processing techniques by the inherent growth requirements of the crystals. Unlike crystalline silicon, amorphous silicon and germanium alloys can be deposited in multiple layers over large area substrates to form semiconductor devices such as solar cells in a high volume, continuous processing system. Such continuous processing systems are disclosed in the following U.S. Pat. Nos. 4,400,409, for "A Method of Making P-Doped Silicon Films And Devices Made Therefrom"; 4,410,588, for "Continuous Amorphous Solar Cell Deposition And Isolation System And Method"; 4,542,711, for "Continuous Systems For Depositing Amorphous Semiconductor Material"; 4,492,181 for "Method And Apparatus For Continuously Producing Tandem Amorphous Photovoltaic Cells"; and 4,485,125 for "Method And Apparatus For Continuously Producing Tandem Amorphous Photovoltaic Cells." As disclosed in these patents, the disclosures of which are incorporated herein by reference, a substrate may be continuously advanced through a succession of deposition chambers, wherein each chamber is dedicated to the deposition of a specific semiconductor material. For example, in making a solar cell of n-i-p type configuration, the first chamber is dedicated for depositing an n-type amorphous silicon alloy, the second chamber is dedicated for depositing an intrinsic amorphous silicon alloy, and the third chamber is dedicated for depositing a p-type amorphous silicon alloy.

The layers of thin film semiconductor alloy material thus deposited in the vacuum envelope of the deposition apparatus may be utilized to form a photovoltaic device including one or more p-i-n cells, one or more n-i-p cells, a Schottky barrier, as well as photodiodes, phototransistors, other photosensors, memory arrays, display devices or the like. Additionally, by making multiple passes through the succession of deposition chambers, or by providing an additional array of deposition chambers, multiple stacked photovoltaic cells or other semiconductor devices of various configurations may be fabricated.

The concept of utilizing multiple cells, to enhance photovoltaic device efficiency, was described at least as early as 1955 by E. D. Jackson in U.S. Pat. No. 2,949,498 issued Aug. 16, 1960. The multiple cell structures therein discussed utilized p-n junction crystalline semiconductor devices. Essentially the concept employed different band gap devices to more efficiently collect various portions of the solar spectrum and to increase open circuit voltage (Voc). The tandem cell device (by definition) has two or more cells with the light directed serially through each cell. In the first cell, a large band gap material absorbs only the short wavelength light, while in subsequent cells smaller band gap material absorb the longer wavelengths of light which pass through the first cell. By substantially matching the generated currents from each cell, the overall open circuit voltage is the sum of the open circuit voltage of each cell, while the shirt circuit current thereof remains substantially constant. The photovoltaic device which includes multiple cells, preferably also includes a back reflector for increasing the percentage of incident light reflected from the substrate back through the active semiconductor alloy material of the cells. It should be obvious that the use of a back reflector, by increasing the amount of incident light which is converted to electricity by the semiconductor alloy material, increases the operational efficiency of the photovoltaic device. However, all layers deposited atop the light incident surface of the substrate must be transparent so as to pass a high percentage of incident light from the anti-reflective coating atop the photovoltaic cell to the highly reflective surface of the back reflector from which it is redirected through the semiconductor layers.

The back reflectors formed atop the deposition surface of the substrate if a nontransparent substrate is employed (or atop the body of semiconductor alloy material if a glass substrate is employed) of a photovoltaic device may be either specular or diffuse. With either type of back reflector, light which has initially passed through the active body of semiconductor alloy material of the device, but which is unabsorbed on its initial pass, is redirected by the highly reflective material of the back reflector to pass, once again, through said active body of semiconductor alloy material. The additional pass results in increased photon absorption and charge carrier generation, thereby providing increased short circuit current. In the case of specular back reflectors, wherein the highly reflective material is conformally deposited over a smooth surface, the unused light is generally redirected for one additional pass through the active body of semiconductor alloy material of the device.

Conversely, diffuse back reflectors comprise highly reflective material which is either conformally deposited over a textured surface, or grown in a textured manner upon an underlying surface. Light incident upon said textured back reflector is scattered in addition to being redirected through the active semiconductor alloy material, thereby mandating that a portion of the redirected light travel at angles sufficient to cause said redirected light to be substantially confined within the photovoltaic device, i.e., achieve total internal reflection. Further, since textured, diffuse back reflectors redirect light through the active semiconductor alloy material of the device at an angle, the active semiconductor alloy material can be made thinner than otherwise possible, thereby reducing charge carrier recombination, while still maintaining efficient charge carrier generation and promoting charge carrier collection.

As should be apparent from the foregoing discussion, and since the purpose of a back reflector of a photoresponsive device is to redirect incident light for at least a second pass through the active body of semiconductor alloy material thereof, absorption of that incident light by the back reflector cannot be tolerated. Accordingly, only when very highly reflective, vis-a-vis, absorptive, materials are employed from which to fabricate the back reflector, is the overall efficiency of the photoresponsive device optimized. For use as back reflectors, the most highly reflective material is silver which is characterized by an integrated reflectivity of about 94%. Aluminum is another highly reflective back reflector material commonly suggested from which to fabricate back reflectors, said aluminum material having an integrated reflectivity of about 88%. Yet another highly reflective material which has been proposed for use as a back reflector is copper which is characterized by an integrated reflectivity of about 70%. The last of the most commonly employed reflective materials from which back reflectors are fabricated, is stainless steel having an integrated reflectivity of about 45%. While stainless steel is not nearly as reflective (and indeed, was not described as "highly" reflective) as aluminum, silver, and copper, it has been utilized as a substrate material and hence remains a possible candidate when economic factors are taken into consideration.

Back reflectors commonly formed of the aforementioned highly reflective elements and alloys thereof have been employed in an attempt to provide a suitable light redirecting layer for photoresponsive devices. However, when said highly reflective materials have been employed to improve utilization of incident light, the interdiffusion of the semiconductor alloy material and the highly reflective material was found to be a very significant problem. It was in an attempt to alleviate such diffusion problems (primarily diffusion between elements of the highly reflective material and the body of semiconductor material) that back reflectors formed from such highly reflective materials as aluminum, copper and silver, have been sandwiched between layers of (1) chromium, (2) titanium and titanium oxide, and (3) titanium and tin oxide. However, the use of the adhesion promoting and diffusion inhibiting layers (also referred to as "buffer layers") was not totally effective. The layers had to be deposited to a very thin thickness in order to prevent the layers from absorbing incident light. However, due to their thinness, these layers could not effectively prevent interdiffusion. Alternatively, if the layers were deposited so as to prevent diffusion, the layer would be so thick as to absorb incident light.

For solar cells fabricated on an opaque substrate, following the deposition of the back reflector and buffer layer upon the substrate and the layers of semiconductor alloy material upon the buffer layer, a further deposition process must be performed. In this step a thin, transparent layer of electrically conductive, light transmissive material comprised of, for example, a wide band gap oxide material such as an alloy of indium, tin and oxygen (ITO) or indium doped zinc and oxygen, is deposited atop the layers forming the body of semiconductor alloy material. In the case of photovoltaic cells or photosensors, this transparent, conductive oxide layer forms one of the electrodes thereof. It is the process of continuously and economically depositing such a thin, electrically conductive, light transmissive oxide layer in electrical communication with a body of semiconductor alloy material, to which the present invention is primarily directed.

There are a wide variety of such transparent conductive materials having particular utility in the fabrication of semiconductor devices, such as photovoltaic cells. Generally, materials such as degenerate semiconductors, wide band gap semiconductors, thin metallic films and cermets may be utilized to form the transparent conductive layer. Among some of the specific materials which may be utilized are indium oxide, tin oxide, indium tin oxide, cadmium stannate, zinc oxide, and combinations thereof. While the description herein will primarily be concerned with the deposition of thin, transparent, electrically conductive materials above or below the layers of semiconductor alloy materials as a step in the fabrication of photovoltaic devices, it should be understood that such transparent conductive films also have utility in other electronic devices such as liquid crystal displays, photosensors, light emitting diodes, photochromic, electrochromic devices and the like. Further, such transparent films may also serve other functions in photovoltaic devices, such as, for example, as a buffer layer between said back reflector and said body of semiconductor material.

There are a number of techniques utilized to deposit layers of transparent conductive material in contact with semiconductor bodies. Vacuum evaporation is one such technique. A typical vacuum evaporation process is carried out in a chamber maintained within a pressure regime substantially below atmospheric, typically in the range of $10^{-3}$ to $10^{-6}$ Torr. A charge of the material to be evaporated is placed in a crucible and heated by resistance, induction or electron beam bombardment to produce a vapor thereof, which vapor condenses upon the semiconductor body or other substrate is supported in close proximity to the crucible.

While vacuum evaporation techniques have the advantage of being relatively simple, they are not always well suited for the commercial, high volume preparation of semiconductor devices. First of all, vacuum evaporation processes require relatively low pressures thus necessitating lengthy and complex pump-down procedures. Furthermore, the scale-up of a vacuum evaporation process from a research to a commercial scale, continuous production apparatus is relatively difficult because of the high degree of dependence of the process parameters upon the geometry of the deposition system. It has also been found that in many applications evaporated coatings manifest poor adhesion with the underlying layers upon which they are deposited. And most importantly, evaporation techniques are inherently slow and therefore represent a potential bottleneck in an overall continuous fabrication process.

In contrast to vacuum evaporation, plasma processes such as sputtering, plasma assisted chemical vapor deposition (glow discharge), plasma activated evaporation and the like are fast, easy to control and scale-up, and provide highly adherent coatings. Consequently, they may be advantageously employed in the fabrication of layers of transparent conductive material. In a typical sputtering process, a d.c. or radio frequency signal is employed to generate ions from a working gas maintained at a pressure of typically about $10^{-3}$ torr. Such ions are strongly attracted to, and consequently bombard, an electrically biased target (also referred to as a cathode), thereby ejecting particles of the target material, which particles deposit onto the exposed surface of a substrate maintained in close proximity thereto. In the preparation of a layer of indium tin oxide for example, the face of the target or cathode is a body of solid indium tin oxide material. A working gas, typically argon, is ionized and attracted to the target. The energetic impingement of the argon ions ejects small particles of the indium tin oxide material from the target, which particles condense upon the exposed surface of a substrate.

In a typical glow discharge deposition process, a gaseous reagent is introduced into a low pressure environment and subjected to electromagnetic energy so as to create an activated plasma therefrom. In this plasma, the gaseous reagent mixture reacts to form ionic species which subsequently deposit on a biased substrate maintained within the low pressure environment. In an activated evaporation process, vapor of a precursor material is subjected to an energetic input so as to create a plasma therefrom for facilitating the creation and maintenance of desirable coating species.

As mentioned hereinabove, plasma processes are desirable for use in the deposition of thin layers of transparent, electrically conductive material in the manufacture of electronic devices because such processes are easy to control, can achieve high deposition rates and may be readily scaled-up for large volume production. However, sputter coating or other plasma processes have often been found to result in damage to the underlying body of semiconductor material (or other substrate) upon which the coating material is being deposited. Such damage decreases the efficiency or deleteriously effects other operational parameters of the electronic devices and in some instances can render them completely inoperative. Damage occasioned during the plasma coating of a semiconductor body can result from the energetic impingement of ionic or other energetic species upon that semiconductor body. Such bombardment can, for instance, produce mechanical damage to the semiconductor alloy material, which damage is manifested as broken chemical bonds, vacancies in the matrix of the semiconductor material, and/or over-or-under-coordinated valencies in atoms from which the semiconductor alloy material is formed. In other instances, the ions impinging upon the body of semiconductor alloy material are reactive species themselves and as such partially denature the semiconductor layer; for example, oxygen or nitrogen ions can produce oxide or nitride species in the host matrix of the semiconductor alloy material, thereby dramatically changing its optical, chemical and electrical properties. In other instances, the reactive ions can create an interfacial layer between the depositing material and the body of semiconductor alloy material, thereby limiting electrical contact of the deposited layer with the semiconductor body.

In general, mechanical damage to, or the chemical reaction occasioned by ions or other energetic species depositing upon, the body of semiconductor alloy material produces defect states therein, which defect states adversely affect the operation of the device being fabricated therefrom. For example, it has been found that when a layer of indium tin oxide is sputter deposited onto a body of amorphous silicon or amorphous germanium alloy materials for the fabrication of a photovoltaic device, such silicon germanium body will be damaged due to the energetic sputtering process. In some instances, this damage may be mitigated by employing a very weak and hence very slow rate sputtering process; however, a such a slow process is impractical for purposes of commercial scale production.

The aforementioned plasma techniques have also been employed for the deposition of buffer layers of electrically conductive, wide band gap oxide materials between a body of semiconductor alloy material and the hereinabove discussed back reflector layer. While these techniques have proven to be generally successful for laboratory or batch processing, several areas exist in which improvements may be realized. Specifically, the deposition rates of these materials by the above mentioned techniques is relatively slow, i.e., about 1-5 Angstroms per second. This rate becomes commercially impractical in, for example the deposition of a 5000 angstrom thick buffer layer.

In Applicants' continuous solar cell fabrication apparatus, the layers of semiconductor alloy material are now deposited at about 14 Angstroms/second. It is expected that further improvements in the deposition process would increase that rate to about 18 Angstroms/second within six months. The rate of 1-5 Angstroms/second previously achieved for the deposition of transparent oxide materials therefore represents the bottleneck in the overall solar cell fabrication process. This rate must be improved in order to be able to incorporate the deposition of the transparent oxide material as part of an integrated roll-to-roll fabrication technique.

Additionally, layers deposited by previous activated plasma techniques are exceedingly "smooth" in that they do not enhance the light scattering characteristic of the textured highly reflective back reflector. Indeed, it has been observed that exceedingly smooth layers contribute to specular reflection of light incident upon said back reflector. Even if deposited on diffuse back reflective surfaces, said techniques tend to preferentially deposit in the "valleys" and present a smooth, uniform upper surface.

Another technique which has been explored for depositing layers of wide band gap oxide material is a chemical spray pyrolysis technique, which technique allows for the rapid deposition of relatively high quality material. To date, these techniques have been successfully employed in the batch process fabrication of ZnO/p-CuInSe$_2$ heterojunction solar cells, as described by M. S. Tomar and M. J. Garcia in *Thin Solid Films*, 90(1982) 419–423. Further discussion of spray pyrolysis batch deposition of ZnO$_x$ in heterojunction solar cells can be found in an article published in the *Journal of Vacuum Science Technology*, 16(4), July/August 1979, by J. Aranovich, A. Ortig and R. Bube. These publications discuss spray pyrolysis as being pertinent to the field of heterojunction solar cells prepared by batch processing. However, up to the date of the instant application, there has been no consideration of employing a spray pyrolysis technique for depositing wide band gap oxides, in a continuous manner, for the fabrication of amorphous silicon photovoltaic devices.

Thus, there remains a significant need for a high deposition rate process which will not damage the material upon which it is deposited. Such a process may be readily adapted for the high rate deposition of a wide variety of materials, as a step in the fabrication of photovoltaic devices, photosensors, imaging devices, display devices and other opto-electronic devices. The instant invention thus makes possible, on a continuous basis, the large scale, high yield, commercial scale production of a wide variety of semiconductor devices.

These and other advantages of the instant invention will be apparent from the brief description, the drawings and the detailed description thereof which follow.

BRIEF SUMMARY OF THE INVENTION

There is disclosed herein a method of continuously fabricating a photogenerative device such as a photovoltaic cell, which device includes a continuous, elongated web of substrate material, a light scattering back reflector, a body of semiconductor material, and a transparent conductive electrode. The improvement comprising the step of continuously depositing, by chemical spray pyrolysis, a layer of doped or undoped, wide band gap (i.e., transparent) oxide material on said photogenerative device. It is important to note that the process of the subject patent application may include the further step of depositing said layer of transparent oxide between the light scattering back reflector and said body of semiconductor material, said layer being adapted to enhance light scattering provided by said back reflector and to also substantially prevent interdiffusion between said semiconductor body and said back reflector. The process of the instant patent application may also be employed for depositing a layer of wide band gap oxide material upon the body of semiconductor material as the transparent conductive electrode of the photovoltaic device.

The wide band gap oxide material is typically selected from the group consisting essentially of zinc oxide, tin oxide, indium oxide and combinations thereof, which combinations may further include operative amounts of an electrically conductive dopant selected from the group consisting essentially of indium, tin, copper and combinations thereof. The transparent oxide material is deposited by chemical spray pyrolysis technique whereby a solution containing the wide band gap oxide material to be deposited is prepared in a mixture of, for example, water and isopropyl alcohol. Thus, in the case of a zinc oxide layer of wide band gap oxide material, a 0.1M solution of zinc acetate is prepared and maintained in a solution reservoir, for subsequent transportation, under a constant pressure head, to a nozzle adapted to uniformly spray said solution along with a carrier gas, such as compressed air onto the photoresponsive device to which treatment is being applied. The zinc acetate solution may include a dopant, for example, indium as mentioned hereinabove to provide electrical conductive properties. The photoresponsive device to which the treatment is to be applied is maintained at an elevated temperature of between 200 and 400 degrees Centigrade.

The method of the instant invention may be readily adapted for a continuous deposition process by providing an elongated, flexible web of substrate material, and continuously advancing the substrate through an apparatus having at least one spray coating station therein.

THE DETAILED DESCRIPTION OF THE DRAWINGS

I. The Photovoltaic Device

Figure 1:
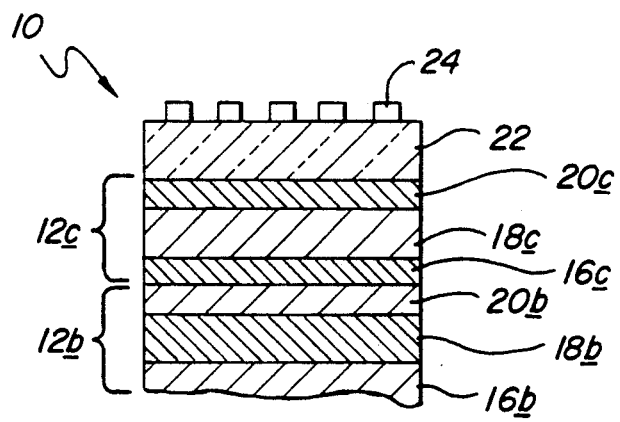
FIG. 1 is a fragmentary cross-sectional view of a stacked photovoltaic device comprised of a plurality of n-i-p type photovoltaic cells.
Figure 1:
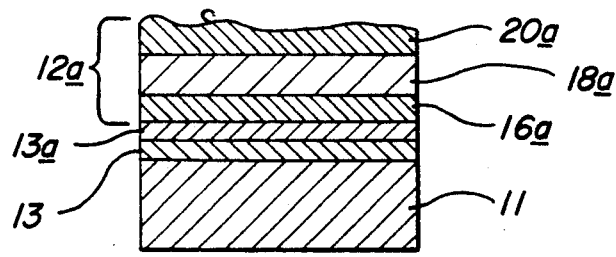

Referring now to the drawings, particularly FIG. 1, there is illustrated a photovoltaic device 10 formed from a plurality of successively deposited p-i-n layers of semiconductor alloy material. As will be described in detail hereinafter, the photovoltaic device 10 illustrated in FIG. 1 typically includes highly reflective back reflector.

More particularly, FIG. 1 shows a p-i-n type photovoltaic device such as a stacked series of solar cell comprising individual p-i-n type cells 12a, 12b and 12c. At the bottom of the stacked photovoltaic device is a substrate 11 which functions as the bottom electrode; and which may be either transparent or formed from a metallic material such as stainless steel, mild steel, aluminum, tantalum, molybdenum or chromium. Although certain applications may require a tin oxide layer and/or a series of base contacts prior to the deposition of the semiconductor alloy material, for purposes of this application the term "substrate" shall include not only the flexible support film, but also any other elements added thereto by preliminary processing.

Between the lowermost cell 12a and the substrate 11 is the highly reflective back reflector 13, and a layer of wide band gap oxide material 13a, which oxide material is adapted to function as a buffer layer. As discussed hereinabove, the back reflector is a deposited layer of highly reflective material, which in one preferred embodiment of the instant invention is silver. The silver layer 13 is deposited upon the substrate 11 to a thickness of approximately 5000 Angstroms (for complete coverage of the substrate 11), and is highly textured with sub-micron scale features so as to promote the random scattering of light reflected thereoff. Deposited atop the silver back reflector layer 13 is the barrier or buffer layer 13a adapted to prevent interdiffusion of the material from which the underlying back reflector is fabricated and the material from which overlying the semiconductor body is fabricated. The buffer layer 13a is further adapted to not only maintain, but enhance the light scattering characteristic of the back reflector 13. This is accomplished by the chemical spray pyrolysis deposition process of the instant invention in that the buffer layer 13a of wide band gap oxide material solidifies in such a manner as to enhance the texture thereof beyond the texturing provided by the specular surface of the back reflector 13. The buffer layer 13a is typically fabricated from a wide band gap oxide material, which may be either doped or undoped. The wide band gap oxide material is typically selected from the group consisting of zinc oxide, indium oxide, tin oxide, and alloy and combinations thereof.

Each of the discrete overlying cells 12a, 12b and 12c are fabricated with an amorphous semiconductor body containing at least a silicon or germanium alloy. Each of the semiconductor bodies includes an p-type conductivity semiconductor layer 20a, 20b and 20c; an intrinsic semiconductor layer 18a, 18b and 18c; and an n-type conductivity layer 16a, 16b and 16c. As illustrated, cell 12b is an intermediate cell and as indicated in FIG. 1, additional intermediate cells may be stacked atop the illustrated cells without departing from the spirit or scope of the present invention.

It is to be understood that following the deposition of the semiconductor layers, a further deposition process may be either performed in a separate environment or as part of a continuous process. It is in this step that a transparent conductive oxide layer 22 formed, in a preferred embodiment, of a transparent, electrically conductive, wide band gap oxide material, such as indium tin oxide or zinc oxide, also referred to herein as the top electrode, is deposited atop the body of semiconductor alloy material. It may be appreciated that the wide band gap oxide, top electrode layer may be deposited by the chemical spray pyrolysis technique of the instant invention. An electrode grid 24 may be applied atop the photovoltaic device when the individual cells thereof are of especially large area, or when the conductivity of the transparent conductive oxide layer 22 is insufficient to provide adequate current collection. Note that care must be taken to (1) fabricate the oxide material of the desired conductivity by selecting the appropriate degree of oxygen deficiency; and (2) fabricate said oxide material at a sufficiently low deposition temperature that the subject body of semiconductor alloy material is not deleteriously effected.

While the device illustrated in FIG. 1 is a stacked assembly of discrete solar cells, the instant invention may also be employed with other cell arrangements such as a single p-i-n cell, stacked or single n-i-p cell, p-i-n Schottky barrier cells and the like. Accordingly, in the description and the claims which follow, the layers of semiconductor alloy material disposed between the substrate 11 and the upper electrode will be referred to as the "body of semiconductor material," said term intended to include combinations of layers of semiconductor alloy material of specific photoconductive properties which are adapted to provide for a flow of electrical current when appropriately combined with one or more electrodes. This flow of electrode current is specifically defined to include a switching of current accomplished by photodiodes and photoresistors, as well as the photogeneration of and a collection of charge carrier pairs accomplished by photovoltaic devices.

It is to be noted that the solar cell described hereinabove was formed on an opaque substrate such as stainless steel. However, the novel method of the instant invention is equally adaptable for use with solar cells formed on transparent substrates such as glass. The fabrication of solar cells on either transparent or opaque substrates represent reverse processes wherein either the back reflective layers or the upper electrode is first deposited. The use of transparent substrates means that the substrate becomes the light incident surface, while the use of opaque substrate means that the substrate becomes the light reflective surface. In either event, it becomes necessary to deposit a transparent conductive oxide atop the body of semiconductor alloy material; with opaque substrates, as a top electrode and with transparent substrates, as the buffer layer.

The novel method of the instant invention is also adaptable to solar cells formed with a textured, light scattering, light incident surface, wherein the back reflector is specular, and the deposited buffer is conformally deposited to form a smooth layer thereover.

II. The Continuous Process

Figure 2:
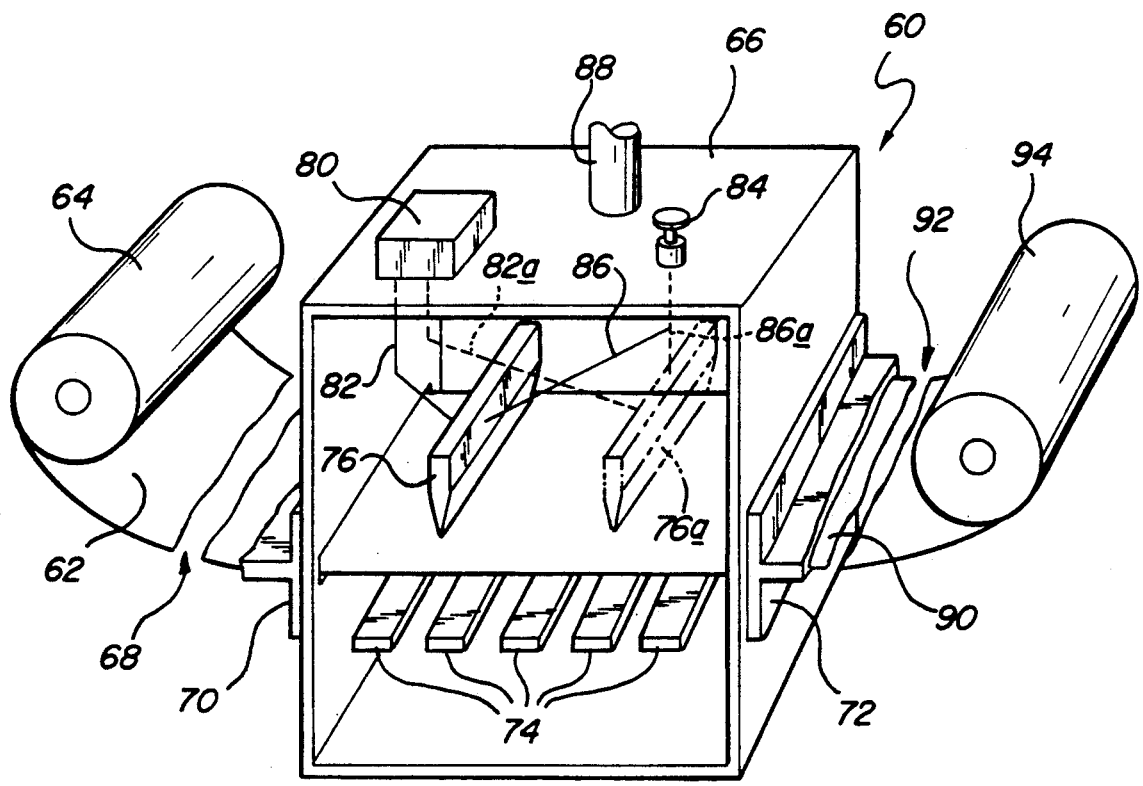
FIG. 2 is a perspective view, somewhat stylized, illustrating apparatus adapted to deposit a layer of doped or undoped wide band gap oxide material, by chemical spray pyrolysis, upon a continuously advancing, elongated web of substrate material.

Turning now to FIG. 2, there is illustrated a somewhat stylized representation of an apparatus 60 adapted to deposit a layer of doped or undoped, wide band gap oxide material, by chemical spray pyrolysis, upon a continuously advancing, elongated web of substrate material 62. The elongated web of substrate material 62, pays off from an elongated roll 64 to and through at least one deposition chamber 66 adapted to coat, by chemical spray pyrolysis, a first (in this case the upper) surface thereof with a layer of said transparent oxide material. The transparent oxide material is typically selected from the group consisting essentially of zinc oxide, tin oxide, indium oxide, cadmium stannate and combinations thereof.

As the web of substrate material 62 pays off the substrate roll 64, it may enter one or more preliminary processing chambers, represented by break line 68, prior to entering the spray pyrolysis chamber 66. Examples of the type of preliminary roll-to-roll processing which may take place include, but are not limited to: the deposition of a conductive electrode layer; the deposition of the highly reflective, light scattering back reflector; and the deposition of a body of semiconductor alloy material, such as for example, one or more p-i-n type, amorphous silicon alloy semiconductor photovoltaic devices. Alternatively, the apparatus 60 may be adapted to function as a "stand-alone" unit. Therefore, it is to be understood that said apparatus 60 can be placed at any desired "in-line" location so as to function in conjunction with other roll-to-roll fabrication machinery to deposit a layer of transparent oxide material.

After completing preliminary processing, the elongated web of substrate material 62 enters the chemical spray pyrolysis chamber 66. As may be appreciated from a perusal of FIG. 2, chamber 66 includes for example gas gates 70 and 72 or other apparatus adapted to isolate the interior environment of chamber 66 from the gaseous environment of adjacent chambers (not illustrated) connected thereto. These gas gates are necessary since the process gasses introduced into said adjacent chambers may contaminate the gaseous environment of chamber 66 and deleteriously effect the layer of transparent oxide material deposited in the chemical spray pyrolysis chamber. Similarly, the gaseous-environment present in the interior of pyrolysis chamber 66 may contaminate and deleteriously effect the deposition environment present in the adjacent chambers.

Since the spray pyrolysis process takes place in a substantially ambient environment, there is no need to isolate the interior of chamber 66 from ambient conditions. It is noteworthy that the presence of air (an oxidizing gas which is widely known to degrade the quality of deposited layers of amorphous silicon alloy material) in the deposition chamber 66 does not measurably effect the quality of those layers. It is also noteworthy that air and the elevated temperatures present interiorly of the chamber 66 (discussed in detail hereinbelow) are typically expected to (1) react with the exposed surface of the highly reflective back reflector, thereby tarnishing or dimming same and reducing the amount of light effectively reflected therefrom; or (2) react with the layers of amorphous silicon alloy material, thereby introducing an additional number of defect states into the energy gap thereof and reducing the photovoltaic conversion efficiency of the device fabricated therefrom. The instant inventors hypothesize that these effects are not observed because the rapid formation of the deposited layer of wide band gap oxide material substantially prevents the aforementioned deleterious reactions.

Returning to FIG. 2, as the elongated web of substrate material 62 enters chamber 66 through the gas gate 70, it is heated to, and maintained at a temperature of between 250° and 450° Centigrade by substrate heaters 74 operatively disposed beneath said elongated web. Operatively disposed above the web of substrate material 62 is at least one fan type spray nozzle 76 adapted to: (1) mix operative amounts of a spray mixture solution with a predetermined amount of a carrier gas; and (2) uniformly deliver said carrier gas/spray mixture solution across at least one dimension, preferably the width dimension (i.e., edge-to-edge) of the elongated web of substrate material, so as to achieve a uniform thickness and quality of deposited material across the entire surface area of the web of substrate material. As may be further appreciated from a perusal of FIG. 2, a second spray nozzle 76a, illustrated in phantom outline, may be disposed in chamber 66 to double the rate of deposition of the material. Material quality is not affected by the second spray nozzle 76a as the first sprayed layer dries substantially instantaneously due to the elevated temperature of the web. Alternatively, one or both of the elongated spray nozzles may be replaced with two or more point-source spray nozzles, arranged in side-by-side configuration so as to provide a uniform thickness of the spray mixture solution across the entire transverse width dimension of the web of substrate 62. A single point source spray nozzle may be adapted to travel across the web of substrate 62 in a direction perpendicular to the movement of said substrate 62. It has been determined that for the illustrated geometries, the spray nozzle or nozzles can be preferably operatively positioned above the web of substrate material 62 a distance of between 3 and 18 inches, and preferably 12-18 inches without sacrificing uniformity of thickness or quality.

Regardless of the type of spray nozzle employed, the spray mixture solution is supplied to the nozzle, at a constant pressure, from a spray mixture reservoir 80, operatively positioned atop chamber 66 via conduits 82 and 82a, if necessary. Alternatively, the spray mixture reservoir 80 may be located remotely from the chamber 66, with the spray mixture solution being fed to the spray nozzle by syphon head, gravity head or pump (not shown). The carrier gas, which is typically either compressed air or compressed nitrogen is also supplied to the spray nozzle at a constant pressure, and from a source of said gas (not shown), through valve 84 and conduits 86 and 86a, if necessary. Chamber 66 further includes an exhaust port 88 for evacuating spent process gas from the interior thereof, which exhaust port 88 may be attached to a vacuum pump (not shown) to aid in the evacuation of that gas.

After passing through the chamber 66, the elongated web of substrate material 62 is coated with a doped or undoped layer of wide band gap, oxide material 90 which has been deposited on the exposed surface thereof. The web of substrate material 62, with the layer 90 deposited thereupon may pass through subsequent processing chambers, as is indicated by break line 92. Finally, said web 62 is collected on take-up roller 94. The details of the spray pyrolysis technique will be outlined in the following example.

EXAMPLE

Several sample amorphous silicon photovoltaic devices were prepared by the process of the instant invention. The process was successfully employed for the deposition of both (1) the light scattering buffer layer disposed between the highly reflective back reflector and the body of semiconductor alloy material; and (2) the top, transparent conductive oxide electrode disposed directly upon the subjacent body of semiconductor alloy material. The exact process parameters are described in detail hereinbelow.

For the fabrication of a device similar to that described in detail hereinabove with reference to FIG. 1, the spray mixture reservoir was filled with a spray mixture of a 0.1M solution of zinc acetate ($Zn(CH_3COO)_2$) in a mixture of isopropyl alcohol and water, at a volume ratio of about 3:1. Where necessary, relatively high electrical conductivity of the deposited layer can be achieved by the addition of between 1-4 atomic percent indium, in the form of indium chloride, to the zinc acetate solution. Isopropyl alcohol, which is known to decrease the acidity of the spray mixture solution, may cause a partial precipitation of hydrated zinc oxide in the solution itself. The addition of a few drops of acetic acid ($CH_3COOH$) will restore the acidity of the spray mixture solution, thereby resulting in a clear, precipitate-free spray mixture solution yielding films displaying distinctly superior optical qualities.

The spray mixture solution was fed from the spray mixture reservoir, under a constant pressure head, to the spray nozzle, operatively positioned above the substrate. The substrate was maintained at temperatures ranging from 250° to 450° Centigrade. Compressed air was also fed to the spray nozzle for use as the carrier gas, at a pressure of between 10 and 20 lbs./square inch and a flow rate of about 6-7 liters/min., resulting in a solution spray rate of about 15 cc/min. The substrate was maintained at an elevated temperature so as to ensure substantially instantaneous drying of the spray mixture solution; therefore a uniform, transparent layer was deposited at a rate of between 10-50 Angstroms per second and typically at a rate of about 25-30 Angstroms per second. This rate of deposition represents about an order of magnitude improvement as compared to the rate of deposition attainable with other activated plasma deposition techniques.

Zinc oxide films prepared by the method described hereinabove display excellent optical and electrical properties. Specifically, the optical transmittance of such films is in the range of 80-90% in the visible region of the electromagnetic spectrum. Further, the absorptance of such films is typically less than approximately 2%. The films also possess acceptable electrical properties, for example, the resistivity of the indium doped films is approximately $5 \times 10^{-3}$ ohm-cm, and the sheet resistance of about 200 ohms/square.

It is noteworthy to reiterate that the continuous chemical spray pyrolysis technique described herein is effected without resorting to exotic control of the deposition environment, i.e., the continuous deposition takes place in air, at somewhat elevated temperatures. This is important since elaborate atmospheric controls considerably impact the cost of continuous deposition systems. Further, it is necessary to reiterate the synergism arising out of the expectation of ordinarily skilled artisans that the exposure of either the highly reflective, light scattering back reflector or the body of amorphous silicon alloy material to air and elevated temperatures would degrade the performance of the resulting electronic or photogenerative devices fabricated therefrom. Specifically, (and as previously described) it would be expected that the combination of air and elevated temperature (greater than 250° Centigrade would either (1) oxidize the surface of the back-reflector (typically a layer of aluminum, stainless steel, copper, silver and alloys thereof), thereby degrading the reflective characteristics of the back-reflector; (2) add defect states in the optical gap of the exposed body of semiconductor alloy material, thereby degrading the electrical and/or photogenerative characteristics of devices fabricated therefrom. However, these negative results have not been observed in the samples made to date.

The foregoing examples and description are merely meant to be illustrative of the utility of the method of the instant invention, and are not intended as limitations thereon. It is therefore the claims which follow, including all equivalents, which are intended to define the scope of the instant invention.

We claim:

1. In a process for the continuous fabrication of photovoltaic devices: said devices including a substrate; a light scattering back reflector including a deposited thin film of silver, and a body of thin film layers of silicon alloy material; the improvement comprising the step of: continuously depositing, by chemical spray pyrolysis, a layer of zinc oxide material between the thin film of silver of said light scattering back reflector and said layers of silicon alloy material, said pyrolysis deposited layer adapted to (1) enhance the light scattering provided by said back reflector and (2) substantially prevent interdiffusion between said semiconductor body and said back reflector.

2. A process as in claim 1, wherein said zinc oxide material further includes an electrically conductive dopant.

3. A process as in claim 2, wherein said doped, zinc oxide material is indium doped zinc oxide.

4. A process as in claim 2, wherein said deposited layer of zinc oxide material is approximately 2000-5000 Angstroms thick.

5. A process as in claim 1, wherein said substrate is electrically conductive.

6. A process as in claim 5, wherein said electrically conductive substrate is formed from a material selected from the group consisting essentially of stainless steel, nickel, aluminum, and alloys and combinations thereof.

7. A process as in claim 1, wherein said substrate is electrically insulating, and further includes a layer of transparent electrically conductive material operatively deposited thereupon.

8. A process as in claim 7, wherein said insulating substrate is selected from the group consisting essentially of polyamide, glass, and combinations thereof.

9. A process as in claim 1, wherein said photovoltaic device includes at least one p-i-n type cell formed of amorphous silicon alloy material.

10. A process as in claim 1, wherein said photovoltaic cell further includes an upper electrode formed from a layer of transparent conductive oxide material deposited upon said amorphous silicon alloy material.

* * * * *